United States Patent
Takata et al.

(10) Patent No.: US 7,089,427 B1
(45) Date of Patent: Aug. 8, 2006

(54) SECURITY SYSTEM METHOD AND APPARATUS FOR PREVENTING APPLICATION PROGRAM UNAUTHORIZED USE

(75) Inventors: Hidekazu Takata, Nara (JP); Yuji Tanaka, Nara (JP)

(73) Assignees: Nintendo Co., Ltd., Kyoto (JP); Sharp Kabushiki Kaisha, Osaka (JP)

( * ) Notice: Subject to any disclaimer, the term of this patent is extended or adjusted under 35 U.S.C. 154(b) by 743 days.

(21) Appl. No.: 09/722,404

(22) Filed: Nov. 28, 2000

(51) Int. Cl.
*H04L 9/00* (2006.01)
*H04K 1/00* (2006.01)
*G06F 17/00* (2006.01)
*G11C 7/00* (2006.01)
*A63F 13/00* (2006.01)
*H01L 27/112* (2006.01)

(52) U.S. Cl. .................. 713/193; 726/26; 463/43; 463/44; 463/45; 463/29; 365/195; 705/51; 705/57; 705/58; 705/59

(58) Field of Classification Search ............... 713/193; 365/195; 463/44, 43, 45, 29; 705/50, 51, 705/57–59; 726/26
See application file for complete search history.

(56) References Cited

U.S. PATENT DOCUMENTS 5,226,136 A * 7/1993 Nakagawa ............... 463/44
5,442,704 A * 8/1995 Holtey .................... 711/163
5,754,647 A * 5/1998 Hsu ....................... 711/163
5,818,771 A * 10/1998 Yasu et al. ............... 365/195
5,912,849 A * 6/1999 Yasu et al. ............... 365/195
6,125,054 A * 9/2000 Yusa et al. ............ 365/185.04
6,594,777 B1 * 7/2003 Takata ...................... 714/5

FOREIGN PATENT DOCUMENTS

| JP | 152599 | 8/1984 |
| JP | 63-225839 | 9/1988 |
| JP | 6-250929 | 9/1994 |

* cited by examiner

*Primary Examiner*—Christopher Revak
*Assistant Examiner*—Kaveh Abrishamkar
(74) *Attorney, Agent, or Firm*—Nixon & Vanderhye, PC

(57) ABSTRACT

A semiconductor storage device includes a program ROM and a flash memory, and the program ROM includes a program data storing area and a dummy data storing area, and the flash memory includes a program data storing area and a dummy address storing area. An address comparison circuit compares an input address and a dummy address being stored in the dummy address storing area with each other. An output inhibiting circuit allows to read program data from the program ROM when the both addresses are not coincident with each other, and inhibits the program data from being read at a time of incoincidence. In a case of the incoincidence, an address conversion circuit produces a read address of the flash memory, whereby the program data is read from the flash memory.

32 Claims, 7 Drawing Sheets

F I G. 5
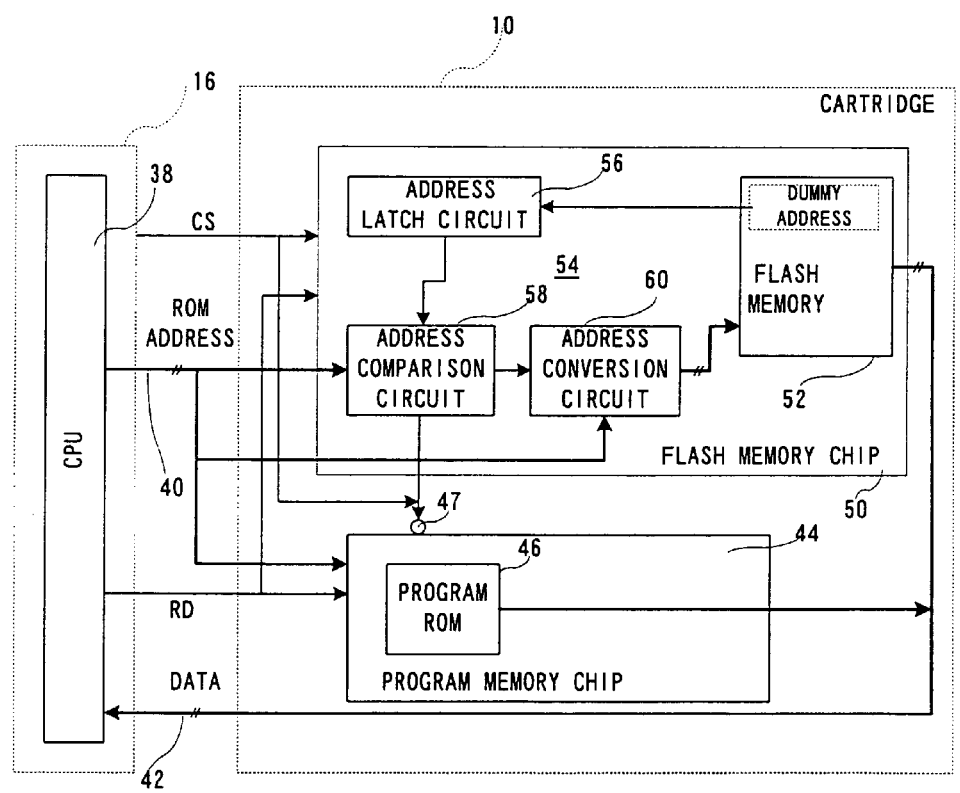

F I G. 7
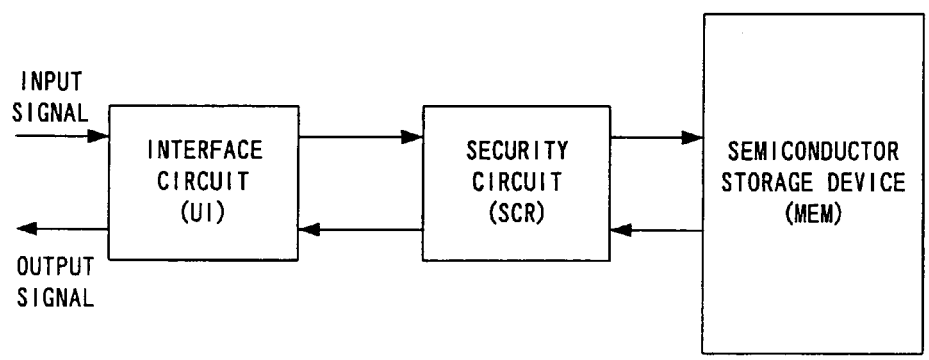
F I G. 8
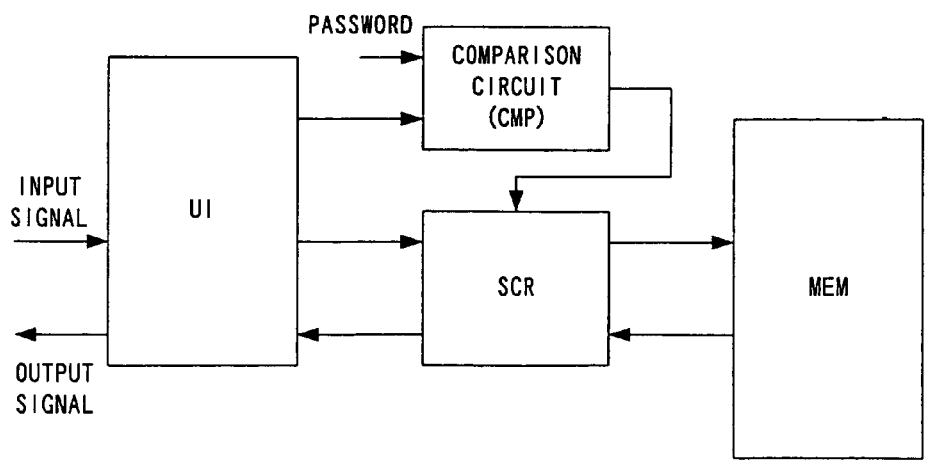

SECURITY SYSTEM METHOD AND APPARATUS FOR PREVENTING APPLICATION PROGRAM UNAUTHORIZED USE

FIELD OF THE INVENTION

The present invention relates to a security system method and apparatus for preventing unauthorized use of an applications program. In accordance with the illustrative implementation, a semiconductor storage device is utilized as, for example, a memory cartridge for a game machine, music storage memory, memory card, IC card etc. and has a security function by which unfair/unauthorized access can be prevented.

BACKGROUND AND SUMMARY OF THE INVENTION

The stored contents of a semiconductor storage device may include data that is undesirable to be read by a third person such as information relating to the privacy of the individual, the information to be protected by a copyright and so on. In order to inhibit the stored contents from being read from the semiconductor storage device without authorization, security circuits have been incorporated in the semiconductor storage devices or peripheral devices for controlling the storage device.

FIG. 7 is a block diagram schematically showing one example of a conventional semiconductor storage device with security circuit. In this prior art, a security circuit SCR is inserted between an interface circuit UI and a semiconductor memory MEM. In reading the semiconductor memory MEM, when an input signal including a read command and a read address is applied to the interface circuit UI, the interface circuit UI analyzes the input signal and transmits the address to the security circuit SCR. The security circuit SCR determines whether or not the transmitted address exists within a memory space that the data is allowed to be read therefrom. If the address is not within the allowed memory space, the security circuit SCR does not apply the read address to the semiconductor memory MEM, and therefore, a normal reading operation cannot be performed. If the address is within the allowed memory space, a correct address is applied from the security circuit SCR to the semiconductor memory MEM. In response thereto, the data is read from the semiconductor memory MEM and outputted to the outside through the interface circuit UI.

The FIG. 7 prior art is a device which intends to protect the stored contents of the semiconductor memory MEM in a manner that when the input address is an address within the allowed memory space, the security circuit SCR does not apply the read address to the semiconductor memory MEM as disclosed in Japanese Patent Application Laying-open No. 59-152599. Furthermore, there is a method involving the read address being disturbed in the security circuit SCR as disclosed in Japanese Patent Application Laying-open No. 63-225839, a method involving the data read from the semiconductor memory MEM being disturbed as disclosed in Japanese Patent Application Laying-open No. 6-250929, and other methods.

A method for removing the security function in the prior art in FIG. 7 is shown in FIG. 8. In FIG. 8, a comparison circuit CMP is utilized. When a password is externally input, the password is input to the comparison circuit CMP. On the other hand, the interface circuit UI fixedly stores a password that is set in advance. The password is also applied from the interface circuit UI to the comparison circuit CMP. The comparison circuit CMP compares the two passwords with each other, and if they are coincident, inputs a security removing signal to the security circuit SCR. Therefore, in this case, the semiconductor memory MEM can be normally accessed, and the normal reading operation can be performed.

In the prior art shown in FIG. 8, in order to control whether or not the security function is to be shown, it is necessary to input the password, and therefore, a security removing method can be easily known by analyzing the input signal. Furthermore, if the semiconductor storage device with security circuit is constructed by a general-purpose ROM chip and a security chip, by removing the ROM chip from a circuit board, it is possible to easily read or copy the data.

Therefore, the illustrative implementations of the present invention are designed to provide a novel semiconductor storage device in which the stored content can be effectively protected from being copied.

The illustrative implementations also provide a semiconductor storage device in which even if the data stored in the ROM is copied, the copied data is made not to be utilized for an original purpose of use.

In accordance with an illustrative implementation, a novel external memory or memory cartridge for a game machine is shown in which an application program or game program can be effectively protected from being copied. The external memory or memory cartridge for a game machine is shown in which even if an application program or game program stored in a ROM is copied, the copied application program or game program is made not to be utilized for its original purpose.

A semiconductor storage according to an exemplary implementation of the present invention is a semiconductor storage device storing regular data and having a security function for preventing unfair use of the regular data, comprising: a first store including a first regular data storing area for fixedly storing first regular data and a dummy data storing area for fixedly storing dummy data; a second store including a second regular data storing area which has a storage capacity equal to at least a storage capacity of the dummy data storing area of the first storing means and fixedly stores second regular data to be originally stored in the dummy data storing area; and a read control mechanism which compares an input address with the dummy data of an address space of the dummy data storing area, to enable reading of the first regular data from the first store when the input address and the dummy address are not identical, and to disable the reading of the first regular data and enable the reading of the second regular data from the second store when the input address and the dummy address are identical.

According to an exemplary implementation of the present invention, even if all the data stored in the first store are read, since further regular data is stored in the second store a part from the first store and the data of the first store includes the dummy data, it is possible to prevent the regular data from being copied as a whole.

More specifically, according to an exemplary implementation of the present invention, the regular data can be normally utilized because the first regular data storing area and the dummy data storing area are formed in the first store, and when the first regular data storing area is accessed, the first regular data is read from the first regular data storing area, and when the dummy data storing area is accessed, the second regular data is read from the second store.

In contrast, even if the stored contents of the first store, i.e. the fist regular data and the dummy data are all unfairly copied without authorization, the dummy data included in the copied data, and therefore, it is impossible to utilize the copied data for the original purpose of use as it is. Therefore, the unfair use can be prevented.

In one implementation of the present invention, the first store includes a masked ROM, and the second store includes a nonvolatile semiconductor memory (a flash memory, for example) which is a writable/readable memory.

The flash memory has a storage capacity larger than a storage capacity of the second regular data storing area, and further includes a dummy address storing area storing the dummy address other than the second regular data storing area, and the dummy address to be applied to the read control mechanism is read from the dummy address storing area.

The flash memory is constructed such that the data is written with a first write voltage in the second regular data storing area and the dummy address storing area, and the data is written with a second write voltage lower than the first write voltage in other areas.

In addition, the flash memory and the read control mechanism is formed within the same single flash memory chip.

In other preferred embodiments, the read control mechanism includes a comparator for comparing the input address and the dummy address with each other to output a first signal or a second signal, an enabling/disabling means for enabling the first storing means in response to the first signal and disabling the first storing means in response to the second signal, and a read address output means for outputting a read address for the second regular data being stored in the second storing means in response to the second signal.

A memory cartridge according to an exemplary implementation of the present invention is a memory cartridge storing an application program and having a security function for preventing unfair use of the application program, comprising: a first storing means including a first program storing area for fixedly storing a first application program and a dummy data storing area for fixedly storing dummy data; a second storing means including a second program storing area which has a storage capacity equal to at least a storage capacity of the dummy data storing area of the first storing means and fixedly stores a second application program to be originally stored in the dummy data storing area; and a read control means which compares an input address with the dummy data of an address space of the dummy data storing area, to enable reading of the first application program from the first storing means when the input address and the dummy address are not identical, and to disable the reading of the first application program and enable the reading of the second application program from the second storing means when the input address and the dummy address are identical.

An electronic equipment according to an exemplary implementation of the present invention is an electronic equipment storing an application program and having a security function for preventing unfair use of the application program, comprising: a first storing means including a first program storing area for fixedly storing a first application program and a dummy data storing area for fixedly storing dummy data; a second storing means including a second program storing area which has a storage capacity equal to at least a storage capacity of the dummy data storing area of the first storing means and fixedly stores a second application program to be originally stored in the dummy data storing area; and a read control means which compares an input address with the dummy data of an address space of the dummy data storing area, to enable reading of the first application program from the first storing means when the input address and the dummy address are not identical, and to disable the reading of the first application program and enable the reading of the second application program from the second storing means when the input address and the dummy address are identical.

A memory cartridge for game machine according to an exemplary implementation of the present invention is a memory cartridge for game machine storing a game program and having a security function for preventing unfair use of the game program, comprising: a first storing means including a first program storing area for fixedly storing a first game program and a dummy data storing area for fixedly storing dummy data; a second storing means including a second program storing area which has a storage capacity equal to at least a storage capacity of the dummy data storing area of the first storing means and fixedly stores a second game program to be originally stored in the dummy data storing area; and a read control means which compares an input address with the dummy data of an address space of the dummy data storing area, to enable reading of the first game program from the first storing means when the input address and the dummy address are not identical, and to disable the reading of the first game program and enable the reading of the second game program from the second storing means when the input address and the dummy address are identical.

In addition, in a case that the second storing means is constructed by an nonvolatile semiconductor memory (a flash memory, for example) and the data is written in the second program storing area with a first write voltage and the data is written with a second write voltage lower than the first write voltage into other areas, in the storing area into which the data is written with the second write voltage, backup data representing the development or progress of the game obtained by executing the first game program and/or the second game program by a processing means of a game machine is written.

In a case that the semiconductor storing device according to an exemplary implementation of the present invention is utilized for a memory cartridge for game machine, if a game main program and/or an important subroutine program is stored in the second game program storing area of the second storing means, unless the second game program is read, it is impossible to execute the game, and therefore, it is possible to implement the copy protect of the game program.

Furthermore, if the second program to be originally stored in the dummy data storing area of the first storing means is stored in the second storing means, and the storage capacity of the second storing means is set to be larger than the storage capacity of the dummy data storing area, by storing data (dummy address) specifying what memory space of the first storing means is the dummy data storing area in the second storing means, the dummy data storing area can be set in an arbitrary memory space of the first storing means. Therefore, it becomes almost impossible to analyze the game program.

Furthermore, in a case that a second storing means further includes a vacant area, if the data that is varied according to the progress or development of the game and necessary for restarting the game after the game is suspended, that is, the backup data such as score point, life, items, player name and etc. is written in the vacant area, it is possible to omit a backup memory which was provided in a conventional cartridge for game machine. That is, the second storing means serves as the second storing means and the backup memory, and therefore, it is possible to reduce the cost.

In addition, if the nonvolatile semiconductor memory is utilized, it becomes unnecessary to provide a backup battery and etc., and therefore, the number of the components can be reduced, and thus, it becomes easy to mount the components on the circuit board.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram showing another embodiment according to the present invention;

FIG. 7 is a schematic block diagram showing one example of a conventional semiconductor storage device with security circuit; and FIG. 8 is a schematic block diagram showing a method for controlling the security circuit in FIG. 7 prior art.

DETAILED DESCRIPTION OF THE PREFERRED EMBODIMENTS

Figure 1:
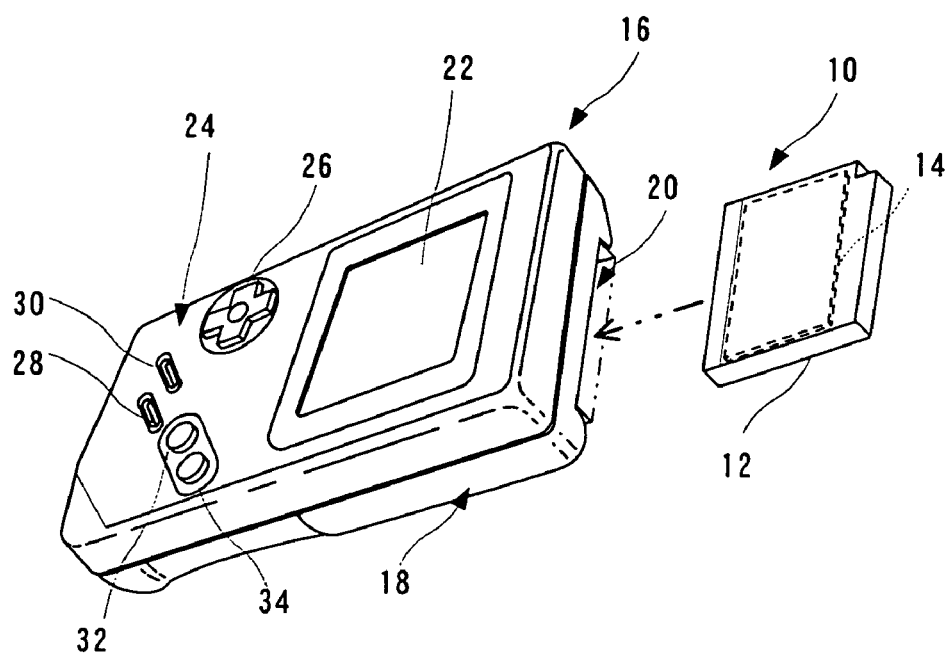
FIG. 1 is an appearance view showing a memory cartridge for game machine of one embodiment according to the present invention and a portable game machine utilizing the memory cartridge.

With reference to FIG. 1, an external memory which is by way of example a memory cartridge for a game machine (hereinafter, may be simply called as "cartridge") 10 that is an embodiment according to the present invention includes a cartridge case 12 and a circuit board 14 accommodated in the cartridge case 12, and on the circuit board 14, a program memory chip 44 and a flash memory chip 50 (FIG. 2: described later) are mounted. The cartridge 10 is attached, while in use, to the portable game machine 16.

The portable game machine 16 is a well-known game machine such as "GAME BOY" (trademark) for example, and includes a housing 18 having a rectangular shape approximately, and on an upper side surface of the housing 18, a cartridge insertion port 20 is formed. The cartridge 10 is inserted to the cartridge insertion port 20, and electrically connected to the portable game machine 16 by an edge connector (not shown) formed on the circuit board 14 of the cartridge 10 and a connector (not shown) arranged in an inner part of the insertion port 20.

On one main surface of the housing 18 of the portable game machine 16, a liquid crystal display (LCD) 22 is provided in an upper portion, and below the LCD 22, an operating key group 24 is provided. The operating key group 24 includes a cross key or a direction designating key 26, a start key 28, a select key 30, an A button 32 and a B button 34. These keys or buttons are operated in playing the game and implement predetermined functions.

The direction designating key 26 is used for determining a moving direction of objects within a game screen displayed on the LCD 22 or for moving a cursor. The start key 24 is mainly used for starting the game after the cartridge 10 is attached and a power source switch (not shown) is turned-on. The select key 30 is mainly used for selecting a game mode. The A button 32 functions as an action button for causing the objects displayed in the game screen to take any actions, and a decision button. The B button 34 functions as a cancel button for canceling the objects actions decided through an operation of the A button 32.

However, the portable game machine 16 is cited as being an example of one such game system for use with the exemplary security system described herein. The illustrated security system is contemplated for use in conjunction with the video game system (and emulated versions thereof) described in the concurrently filed application entitled "Portable Video Game System and in application Ser. No. 09/627,440, filed on Jul. 28, 2000. Both the concurrently filed application and application Ser. No. 09/627,440 are hereby expressly incorporated herein by reference.

Figure 2:
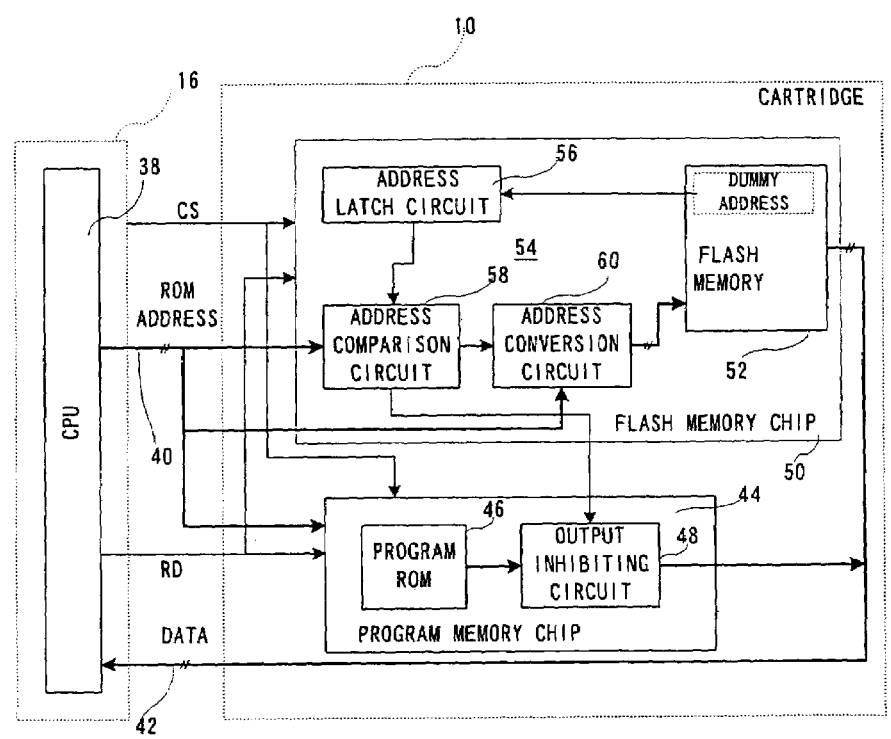
FIG. 2 is a block diagram showing FIG. 1 embodiment.

In FIG. 2, it is indicated that a CPU 38 is included in the portable game machine 16, but it is needless to say that the game machine 16 is provided with many components which cooperate with the CPU 38 other than the CPU 38.

The cartridge 10 and the CPU 38 of the game machine 16 are coupled with each other by at least an address bus 40 and a data bus 42, and these buses 40 and 42 are connected through the aforementioned connectors (not shown). The address bus 40 sends a ROM address outputted from the CPU 38 to the cartridge 10, and the CPU 38 receives data read from the cartridge 10 via the data bus 42. In addition, a chip select signal CS and a read signal RD from the CPU 38 are applied to the cartridge 10.

Figure 3:
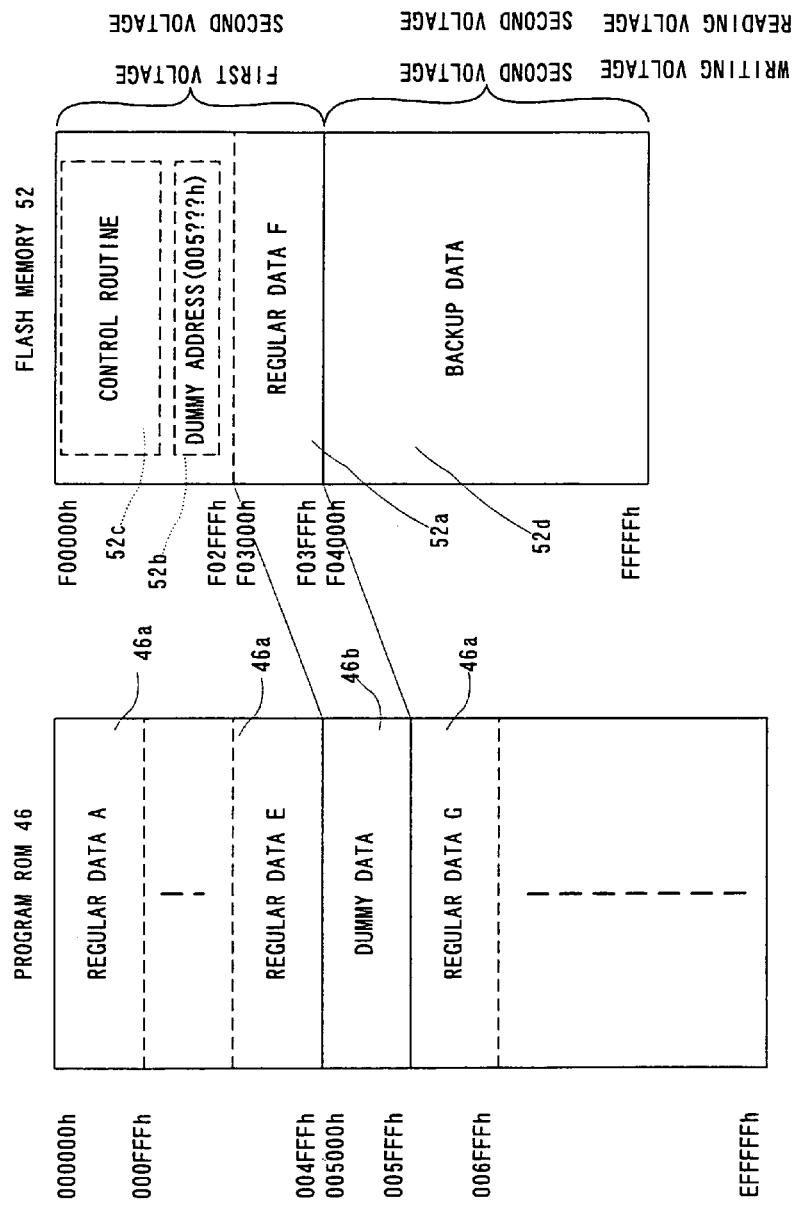
FIG. 3 is an illustrative view showing memory maps of a program ROM and a flash memory both included in the memory cartridge of FIG. 1 embodiment.

In the cartridge 10, a ROM such as a masked ROM (EPROM, EEPROM, for example) is incorporated as the program memory chip 44, and the program memory chip 44 includes a program ROM 46 and an output inhibiting circuit 48. The program ROM 46 includes a regular data storing area 46a into which regular data is written in advance and a dummy data storing area 46b into which dummy data is written in advance, as shown in FIG. 3. In a case of the embodiment shown, the regular data is data such as a game program and data of game characters and indispensable data for executing the game. Furthermore, the dummy data is, as different from the regular data, data having no function in executing the game even if the data is read-out, or in reverse, data disturbing the game execution.

The output inhibiting circuit 48 is a circuit for enabling or disabling the reading of the data from the program ROM 46, and constructed by an AND gate, for example, which is opened or closed by a first signal or a second signal from an address comparison circuit 58 (described later). The data read from the program ROM 46 is outputted via the output inhibiting circuit 48 to be applied to the CPU 38 through the aforementioned data bus 42.

Furthermore, the program memory chip 44 is provided with a chip enable terminal, and when the chip select signal SC of a first level is applied to the terminal, the program memory chip 44 is enabled, and when the chip select signal CS of a second level is applied, the program memory chip 44 is disabled. The program memory chip 44 is further provided with a read signal terminal to which the read signal RD outputted from the CPU 38 is applied.

Then, the read address (input address) is applied through the address bus 40 from the CPU 38 of the game machine 16 to the program memory chip 44, and at a time that the program memory chip 44 is enabled, the program data and the character data are outputted from the read address of the program ROM 46 designated by the CPU 38.

Furthermore, the flash memory chip 50 is also incorporated within the cartridge 10, and on the flash memory chip 50, a flash memory 52 and a read control circuit 54 are uniformly formed on the same die or chip. As shown in FIG. 3, the flash memory 52 is formed with a regular data storing area 52*a* and a dummy address storing area 52*b*. In the regular data storing area 52*a*, regular program data and/or character data to be originally stored in the dummy data storing area 46*b* of the program ROM 46 are stored. That is, in the regular data storing area 52*a*, as similar to the regular data storing area 46*a* of the program ROM 46, the data indispensable for executing the game is stored. In the dummy address storing area 52*b*, an address indicative of a memory space of the dummy data storing area 46*b* of the program ROM 46, that is, a dummy address is stored.

In addition, as shown in FIG. 3, the flash memory 52 of the embodiment shown includes two portions in which operation voltages are different from each other, and one of the two portions is a portion of a first voltage, 6 volts of a write voltage, and the other of the two portions is a portion of a second voltage, 3 volts for example of the write voltage. The first write voltage is a high voltage at which the CPU 38 of the game machine 16 cannot write-in the data. The second write voltage is a voltage at which the CPU 38 of the game machine 16 can write-in the data.

Therefore, in the former portion, the regular data storing area 52*a* and the dummy address storing area 52*b*, and further a control routine storing area 52*c* are included, and in these areas 52*a*–52*c*, in shipping the flash memory chip 50 is manufactured, or prior to the mounting of the memory cartridge 10, necessary data are written in advance. Therefore, the data within the areas 52*a*–52*c* cannot be changed by the third person, i.e. a user, consumer, game player and etc. after the shipment of the cartridge 10.

The latter portion is utilized as a backup data storing area 52*d* shown in FIG. 3. In the backup data storing area 52*d*, the backup data such as score point, life, getting items, player name and etc. which are changed in accordance with the development or progress of the game and necessary for restarting the game after the game is suspended is stored. Therefore, if the user desires, after the game is ended, the CPU 38 can write the backup data. If the backup data storing area 52*d* is thus formed within the flash memory 52, it is not necessary to separately provide a RAM (specifically, SRAM) for storing the backup data, and therefore, a single flash memory chip 50 having the backup data storing means and the copy protect means can be utilized, and then it is possible to reduce the cost.

In addition, a read voltage of the flash memory 52 is the same voltage, 3 volts, for example for any portions or areas.

Returning to FIG. 2, the read control circuit 54 provided within the flash memory chip 50 includes an address latch circuit 56, an address comparison circuit 58 and an address conversion circuit 60. The data of the dummy address being stored in the dummy address storing area 52*b* of the flash memory 52 is read and applied to the address latch circuit 56, and latched therein. The data of the dummy address latched in the address latch circuit 56 is applied to the address comparison circuit 58. To the address comparison circuit 58, the read address for the program ROM 46 is also applied through the address bus 40 from the CPU 38. Therefore, the address comparison circuit 58 receives the read address for the program ROM 46, i.e. the input address and the dummy address. The address comparison circuit 58 compares thus applied two addresses with each other, and outputs a first signal (low level, for example) at a time that the both addresses are identical, and a second signal (high level, for example) at a time that the both addresses are not identical. The first signal and the second signal are applied as a open/close control signal of the aforementioned AND gate (not shown) of the output inhibiting circuit 48 included in the program memory chip 44.

The first signal and the second signal from the address comparison circuit 58 are also applied to the address conversion circuit 60, and the address conversion circuit 60 further receives the input address from the address bus 40. The address conversion circuit 60 has a function for converting the input address sent from the address bus 40 into an inside address of the flash memory 52. In the example shown in FIG. 3, the input addresses "005000h-005FFFh" for the program ROM 46 are converted into "F03000h-F03FFFh" for the flash memory 52. However, such the address conversion is performed only a time that the address comparison circuit 58 outputs the first signal.

With referring to FIG. 4, an operation of the embodiment shown will be described. In addition, pay attention that the flowchart shown in FIG. 4 is not a flowchart in which all the steps are executed by the CPU 38 of the game machine 16, and for explaining an operation principle of the embodiment shown in FIG. 1 and FIG. 2 to be understood easily.

Figure 4:
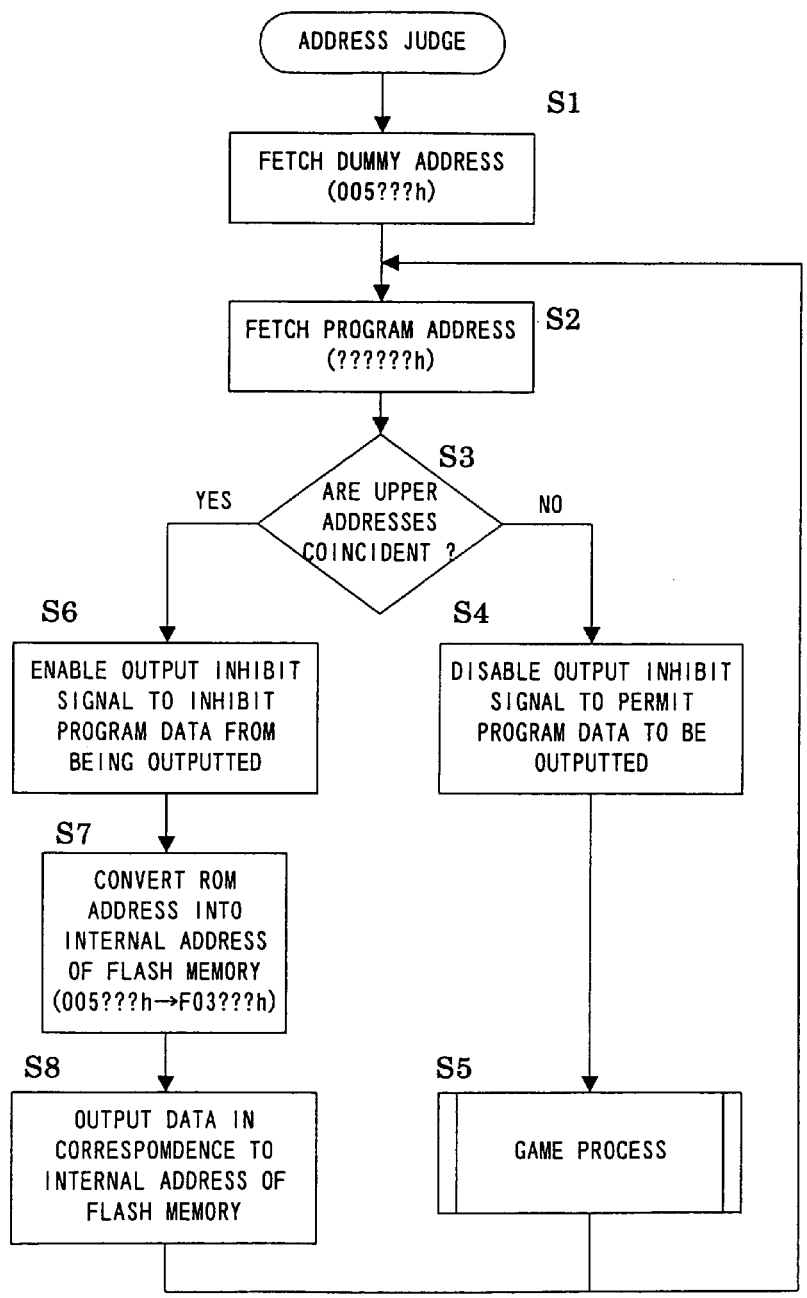
FIG. 4 is a flowchart showing an operation principle of the embodiment shown in FIG. 1 and FIG. 2.

In a step S1 of FIG. 4, the dummy address from the dummy address storing area 52*b* of the flash memory 52 is latched in the address latch circuit 56, and the dummy address is fetched into the address comparison circuit 58. Then, in a step S2, the read address for the program ROM 46 outputted through the address bus 40 from the CPU 38, i.e. the input address is fetched in the address comparison circuit 58. In a step S3, the address comparison circuit 58 compares an upper address (upper 3 bits in the embodiment) of the dummy address and an upper address (upper 3 bits in the embodiment) of the input address with each other, and determines whether or not the both upper addresses are coincident with each other.

In a case that the upper address of the dummy address is set as "005", for example, when "005" is applied as the upper address of the ROM address from the CPU 38, the coincidence is determined, and if the input address has an upper address other than "005", "000"- "004" or "006"- "EFF", for example, the incoincidence is determined.

When the address comparison circuit 58 determines the incoincidence, that is, "NO" is determined in the step S3, in a step S4, the address comparison circuit 58 outputs a high level comparison result signal, i.e. the second signal described above. Therefore, the AND gate (not shown) of the output inhibiting circuit 48 is opened. On the other hand, at this time, the data is read from the read address of the program ROM 46 designated by the CPU 38. Therefore, the data read from the program ROM 46 is applied to the data bus 42 through the output inhibiting circuit 48. Thus, when the both addresses are not identical, the data reading from the program ROM 46 is enabled. Since the read address designated by the CPU 38 is not an address designating the dummy data storing area 46*b* (FIG. 3) of the program ROM 46, the data read in the step S4 is the data read from the regular data storing area 46*a* of the program ROM 46. That is, the data read from the program ROM 46 at that time is the regular data, and the regular data is inputted to the CPU 38 through the data bus 42, and the CPU 38 executes the game by utilizing the regular data in a step S5.

If the coincidence is determined by the address comparison circuit 58, that is, if "YES" is determined in the step S3, as described above, a low level comparison result signal, i.e. the first signal is outputted from the address comparison circuit 58. That is, an output inhibit signal is enabled. Therefore, the data reading from the program ROM 46 is inhibited or disabled. In the example shown in FIG. 3, a fact that the input address is coincident with the dummy address means that the CPU 38 designates the memory space equal to the dummy data storing area 46*b* of the program ROM 46. Therefore, in such a case, if the dummy data is read from the dummy data storing area 46*b* as it is, the development of the game is hindered, and therefore, in a step S6, the reading of the dummy data from the program ROM is disabled.

Succeedingly, in a step S7, the address conversion circuit 60 converts the input address inputted from the address bus 40, i.e. the ROM address into the inside address of the flash memory 52. In the example shown in FIG. 3, a fact that the input address and the dummy address are identical means that the CPU 38 designates the memory space equal to the dummy data storing area 46*b* of the program ROM 46. Therefore, in this case, it is necessary to read the regular program data from the regular data storing area 52*a* of the flash memory 52 instead of the dummy data of the dummy data storing area 46*b*. Therefore, by performing the address conversion in the step S7, the data reading of the flash memory 52 is enabled, and therefore, the regular program data is read from the regular data storing area 52*a* of the flash memory 52. The regular data is read in a step S8, and inputted to the CPU 38 through the data bus 42. Therefore, the CPU 38 performs the game process according to the program data read from the flash memory 52.

In the above described embodiment, in order to disable the data reading from the program ROM 46 when the input address and the dummy address are identical, the output inhibiting circuit 48 is utilized. However, without using the output inhibiting circuit 48, the data reading may be enabled or disabled by the chip select signal CS or the read signal RD applied to the program memory chip 44.

FIG. 5 is a block diagram showing an embodiment wherein the data reading from the program ROM 46 is enabled/disabled by utilizing the chip enable terminal. In this embodiment shown, the output inhibiting circuit 48 used in FIG. 2 embodiment is not utilized. More specifically, the program memory chip 44 includes only the program ROM 46, and the chip select signal CS outputted from the CPU 38 and the comparison result signal from the address comparison circuit 58 are inputted to the chip enable terminal 47 of the program memory chip 44.

Then, the address comparison circuit 58 determines the coincident of the input address from the CPU 38 and the dummy address from the flash memory 52, as described above, the address comparison circuit 58 outputs the low level comparison result signal (the first signal), and the first signal is applied to the chip enable terminal 47. Accordingly, the program memory chip 44 is disabled, and the data reading from the program ROM 46 is also disabled.

In addition, in FIG. 5 embodiment, since both of the chip select signal CS from the CPU 38 and the comparison result signal from the address comparison circuit 58 are inputted to the chip enable terminals 47, it is necessary to apply these signals to the chip enable terminal 47 via a gate circuit by which the comparison result signal takes a priority over the chip select signal CS. Otherwise, since the chip select signal is also outputted when the CPU 38 accesses the dummy data storing area 46*b* of the program ROM 46, the program memory chip 44 becomes to be enabled by the chip select signal CS, and therefore, the comparison result signal (the first signal) from the address comparison circuit 58 does not effectively function.

Figure 6:
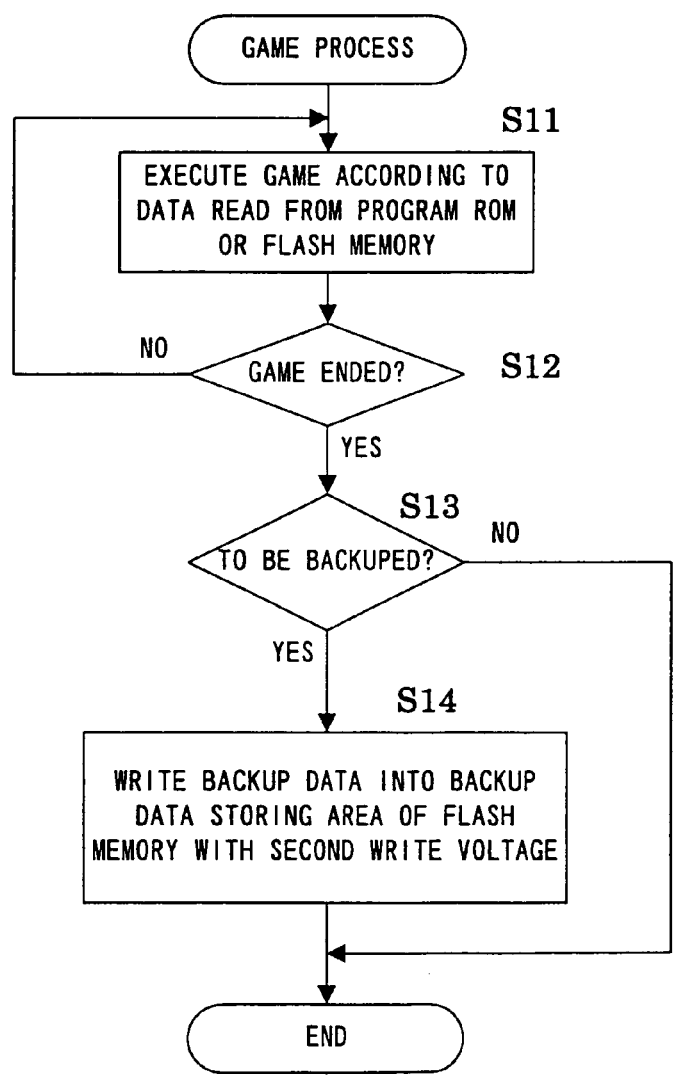
FIG. 6 is a flowchart showing a game processing operation.

An operation that the CPU 38 of the game machine 16 executes the game processing is described with referring to FIG. 6. In a step S11, the CPU 38 executes the game according to the regular program data read from the program ROM 46 or the flash memory 52. Then, if the end of the game is determined in a step S12, the CPU 38 determines whether or not it is necessary to store the backup data according to the key operation of the user in a step S13. If "NO" is determined in the step S13, the process is terminated. In contrast, if "YES" is determined in the step S13, the CPU addresses the backup data storing area 52*d* (FIG. 3) of the flash memory 52 so as to write the backup data into this area 52*d* with the second voltage, 3 volts for example.

In addition, in the above described embodiments, the address data of the dummy data storing area 46*b* of the program ROM 46 is stored in the flash memory 52; however, not limited to such a method. A method for fixedly storing the address data in a hardware, a method for setting the address data by a DIP switch, a method wherein the address data is written in the address latch circuit by the CPU accessing the semiconductor storage device, a method wherein the address data for the dummy data storing area is written in the ROM, and the address data is written in the address latch circuit on the basis of the program, or the like may be utilized.

Furthermore, the present invention can be utilized not only for the memory cartridge for game machine described in the above described embodiments but also for other arbitrary storage device, such as a music data storage device, a memory cartridge or memory card detachably attached to an electric equipment, an IC card, an electronic equipment or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor storage device storing regular data and having a security function for preventing unauthorized use of the regular data, the semiconductor storage device configured for removable connection to a video game system including a video game program executing system and comprising:

a first store including a first storing area for fixedly storing a first portion of the regular data and a dummy data storing area for fixedly storing dummy data in place of a second portion of the regular data, the second portion of the regular data being necessary for use of the regular data;

a second store including a second storing area which has a storage capacity equal to at least a storage capacity of the dummy data storing area of the first store and fixedly stores the second portion of the regular data; and a read control circuit which is electrically connected to the video game program executing system when the semiconductor storage device is connected to the video game system, the read control circuit comparing an input address input thereto from the video game program executing system with a dummy address corresponding to an address space of the dummy data storing area, enabling reading of the first portion of the regular data from the first store when the input address and the dummy address do not correspond, and disabling the reading of the first portion of the regular data and enabling the reading of the second portion of the regular data from the second store when the input address and the dummy address correspond.

2. A semiconductor storage device according to claim 1, wherein the first store includes a masked ROM, and the second store includes a nonvolatile semiconductor memory which is a writable/readable memory.

3. A semiconductor storage device according to claim 2, wherein the nonvolatile semiconductor memory has a storage capacity larger than the storage capacity of the second regular data storing area, and further includes a dummy address storing area, other than the second storing area, for storing the dummy address, and the dummy address supplied to the read control circuit is read from the dummy address storing area.

4. A semiconductor storage device according to claim 3, wherein the nonvolatile semiconductor memory is constructed such that data is written with a first write voltage in the second regular data storing area and the dummy address storing area, and data is written with a second write voltage lower than the first write voltage in other areas.

5. A semiconductor storage device according to claim 1, wherein the read control circuit includes a comparator for comparing the input address and the dummy address with each other to output a first signal or a second signal, an enabling/disabling circuit for enabling the first store in response to the first signal and disabling the first store in response to the second signal, and a read address output circuit for outputting a read address for the second portion of the regular data stored in the second store in response to the second signal.

6. A semiconductor storage device according to claim 2, wherein the nonvolatile semiconductor memory and the read control circuit are formed within the same single memory chip.

7. A memory device storing an application program and having a security function for preventing unauthorized use of the application program, the memory device configured for removable connection to a video game system including a video game program executing system and comprising:
    a first store including a first program storing area for fixedly storing a first portion of the application program and a dummy data storing area for fixedly storing dummy data in place of a second portion of the application program, the second portion of the application program being necessary for use of the application;
    a second store including a second program storing area which has a storage capacity equal to at least a storage capacity of the dummy data storing area of the first store and fixedly stores the second portion of the application program; and
    a read control circuit which is electrically connected to the video game program executing system when the memory device is connected to the video game system, the read control circuit comparing an input address input thereto from the video game program executing system with a dummy address corresponding to an address space of the dummy data storing area, enabling reading of the first portion of the application program from the first store when the input address and the dummy address do not correspond, and disabling the reading of the first portion of the application program and enabling the reading of the second portion of the application program from the second store when the input address and the dummy address correspond.

8. An electronic device for storing an application program and having a security function for preventing unauthorized use of the application program, the electronic device configured for removable connection to a video game system including a video game program executing system and comprising:
    a first store including a first program storing area for fixedly storing a first portion of the application program and a dummy data storing area for fixedly storing dummy data in place of a second portion of the application program, the second portion of the application program being necessary for use of the application program;
    a second store including a second program storing area which has a storage capacity equal to at least a storage capacity of the dummy data storing area of the first store and fixedly stores the second portion of the application program; and
    a read control circuit which is electrically connected to the video game program executing system when the electronic device is connected to the video game system, the read control circuit comparing an input address input thereto from the video game program executing system with a dummy address corresponding to an address space of the dummy data storing area, enabling reading of the first portion of the application program from the first store when the input address and the dummy address do not correspond, and disabling the reading of the first portion of the application program and enabling the reading of the second portion of the application program from the second store when the input address and the dummy address correspond.

9. A memory device storing a game program and having a security function for preventing unauthorized use of the game program, the memory device configured for removable connection to a game machine including a video game program executing system and comprising:
    a first store including a first program storing area for fixedly storing a first portion of the game program and a dummy data storing area for fixedly storing dummy data in place of a second portion of the game program, the second portion of the game portion being necessary for use of the game program;
    a second store including a second program storing area which has a storage capacity equal to at least a storage capacity of the dummy data storing area of the first storing means and fixedly stores the second portion of the game program; and
    a read control circuit which is electrically connected to the video game program executing system when the memory device is connected to the video game system, the read control circuit comparing an input address input thereto from the video game program executing system with a dummy address corresponding to an address space of the dummy data storing area, enabling reading of the first portion of the game program from the first store when the input address and the dummy address do not correspond, and disabling the reading of the first portion of the game program and enabling the reading of the second portion of the game program from the second store when the input address and the dummy address correspond.

10. A memory device according to claim 9, wherein the first store includes a masked ROM, and the second store includes a nonvolatile semiconductor memory which is a writable/readable memory.

11. A memory device according to claim 10, wherein the nonvolatile semiconductor memory has a storage capacity larger than the storage capacity of the second storing area, and further includes a dummy address storing area, other than the second regular data storing area, for storing the dummy address, and the dummy address supplied to the read control circuit is read from the dummy address storing area.

12. A memory device according to claim 11, wherein the nonvolatile semiconductor memory is constructed such that the data is written in the second game program storing area and the dummy address storing area with a first write voltage and data is written with a second write voltage lower than the first write voltage into other areas, and in the storing area into which the data is written with the second write voltage,
 backup data representing a development of the game obtained by executing the game program by a processor of the game machine is written.

13. A memory device according to claim 9, wherein the read control circuit includes a comparator for comparing the input address and the dummy address with each other to output a first signal or a second signal, an enabling/disabling circuit for enabling the first store in response to the first signal and disabling the first store in response to the second signal, and a read address output circuit for outputting a read address for the second portion of the game program stored in the second store in response to the second signal.

14. A method for preventing unauthorized use of regular data stored in a storage device configured for removable connection to a video game system including a video game program executing system, the method comprising:
 storing in a first storage area of the storage device a first portion of the regular data and storing dummy data in a dummy data area of said first storage area in place of a second portion of the regular data, the second portion of the regular data being necessary for use of the regular data;
 storing in a second storage area of the storage device having a storage capacity equal to at least a storage capacity of the dummy data storing area of the first storage area the second portion of the regular data; and
 comparing an input address from the video game program executing system with a dummy address corresponding to an address space of the dummy data storing area and enabling reading of the first portion of the regular data from the first storage area when the input address and the dummy address do not correspond, and disabling the reading of the first portion of the regular data and enabling the reading of the second portion of the regular data from the second storage area when the input address and the dummy address correspond.

15. A method according to claim 14, wherein the first storage area resides in a masked ROM, and the second storage area resides in a nonvolatile semiconductor memory which is a writable/readable memory.

16. A method according to claim 15, wherein the nonvolatile semiconductor memory has a storage capacity larger than a storage capacity of the second storing area, and the method further includes storing a dummy address in a dummy address storing area, and reading the dummy address from the dummy address storing area.

17. A method according to claim 15, further including writing to the nonvolatile semiconductor memory with a first write voltage in certain areas thereof, and writing with a second write voltage lower than the first write voltage in other areas thereof.

18. A method according to claim 15, further including comparing the input address and the dummy address with each other to output a first signal or a second signal, and enabling the first storage area in response to the first signal and disabling the first storage area in response to the second signal, and outputting a read address for the second portion of the regular data being stored in the second storage area in response to the second signal.

19. A storage device configured for removable connection to a video game system including a video game program executing system, the storage device adapted to provide security for a video game program stored therein and comprising:
 a video game program memory for storing a first part of the video game program, and for storing dummy data at one or more predetermined locations thereof;
 a memory separate from the video game program memory for storing a second part of the video game program, the second part of the video game program being a part that is predetermined to be necessary for use of the video game program so that copying of the first part of the video game program and the dummy data from the video game memory will not provide an operable video game program;
 memory control circuitry which is electrically connected to the video game program executing system when the storage device is connected to the video game system, the memory control circuitry for controlling the video game program memory and the separate memory, wherein the memory control circuitry compares an address input thereto from the video game program executing system with an address indicative of the one or more predetermined locations of the video game program memory, enables output from the video game program memory if the input address and the address indicative of the one or more predetermined locations do not correspond, and disables output from the video game program memory and enables output from the separate memory if the input address and the address indicative of the one or more predetermined locations correspond.

20. The storage device according to claim 19, wherein the memory control circuitry comprises an output disabling circuit for disabling the output of the video game program memory if the input address and the address for the separate memory correspond.

21. The storage device according to claim 20, wherein the output disabling circuit comprises a logic circuit.

22. The storage device according to claim 19, wherein the video game program memory and the separate memory are embodied on different chips.

23. The storage device according to claim 19, wherein the video game program memory is disabled in response to a chip select signal if the input address and the address for the separate memory correspond.

24. The storage device according to claim 19, wherein the separate memory comprises a first portion in which data is written using a first writing voltage and a second portion in which data is written using a second, different writing voltage.

25. The storage device according to claim 24, wherein the first voltage is higher than the second voltage and the second part of the video game program is stored in the first portion of the separate memory.

26. The storage device according to claim 25, wherein the first voltage is a voltage different than a writing voltage of video game program executing system so that the video game program executing system cannot write to the first portion of the separate memory.

27. The method according to claim 25, wherein the second voltage is a voltage equal to a writing voltage of the video game program executing system and the video game program executing system selectively writes game back-up data to the second portion of the separate memory using the second voltage.

28. A method for providing security for a video game program stored in a storage device configured for removable connection to a video game system including a video game program executing system, the method comprising:

storing a first part of the video game program in a video game program memory of the storage device;

storing dummy data at one or more predetermined locations of the video game program memory;

storing a second part of the video game program in a memory of the storage device separate from the video game program memory, the second part of the video game program being predetermined to be a part necessary for use of the video game program so that copying of the first part of the video game program and the dummy data from the video game program memory will not provide an operable video game program, wherein an address input to the storage device from the video game program executing system is compared with an address indicative of the one or more predetermined locations of the video game program memory;

access to the video game program memory is enabled if the input address and the address indicative of the one or more predetermined locations do not correspond; and access to the video game program memory is disabled and access to the separate memory is enabled if the input address and the address indicative of the one or more predetermined locations.

29. The method according to claim 28, wherein the separate memory comprises a first portion in which data is written using a first writing voltage and a second portion in which data is written using a second, different writing voltage.

30. The method according to claim 29, wherein the first voltage is higher than the second voltage and the second part of the video game program is stored in the first portion of the separate memory.

31. The method according to claim 30, wherein the first voltage is a voltage different than a writing voltage of the video game program executing system so that the video game program executing system cannot write to the first portion of the separate memory.

32. The method according to claim 30, wherein the second voltage is a voltage equal to a writing voltage of the video game program executing system and the video game program executing system selectively writes game back-up data to the second portion of the separate memory using the second voltage.

* * * * *